April 1, 1969 J. S. KILBY 3,435,516

SEMICONDUCTOR STRUCTURE FABRICATION

Original Filed May 6, 1959

INVENTOR.
Jack S. Kilby

BY John D. Graham
ATTORNEY

United States Patent Office 3,435,516

Patented Apr. 1, 1969

3,435,516

SEMICONDUCTOR STRUCTURE FABRICATION

Jack S. Kilby, Dallas, Tex., assignor to Texas Instruments Incorporated, Dallas, Tex., a corporation of Delaware Continuation of application Ser. No. 467,428, June 28, 1965, which is a continuation of application Ser. No. 189,205, Apr. 20, 1962, which is a division of application Ser. No. 811,470, May 6, 1959, now Patent No. 3,072,832, dated Jan. 8, 1963. This application Jan. 13, 1967, Ser. No. 609,720

Int. Cl. H01l 1/10

U.S. Cl. 29—588

8 Claims

ABSTRACT OF THE DISCLOSURE

A method is disclosed for enclosing a semiconductor device having PN junctions adjacent one major surface of a semiconductor wafer. A support means is provided having a flat solid portion on one surface, and a metallic frame including a plurality of inwardly extending flat tabs is positioned over the one surface of the support with the ends of the flat tabs being co-planar and spaced from each other around the solid flat portion. A closed wall member is positioned about the periphery of the one surface of the support over the flat tabs and the tabs are sealed between the wall member and the support. The semiconductor wafer is secured on the solid flat portion of the support, and a plurality of wires are connected between selected regions on a surface of the semiconductor wafer and selected ones of the flat tabs. A cover is then secured to the wall member.

This application is a continuation of application, Ser. No. 467,428, filed June 28, 1965, now abandoned, which was a continuation of application, Ser. No. 189,205, filed Apr. 20, 1962, now abandoned which was a division of application, Ser. No. 811,470, filed May 6, 1959, now U.S. Patent No. 3,072,832, issued Jan. 8, 1963.

The present invention relates to the formation of structures employing semiconductive materials and more particularly to methods of fabricating packages for semiconductor devices and methods for mounting and/or sealing bars of thin semiconductive materials having various circuit connections and terminals formed thereon.

In my application Ser. No. 791,602, filed on Feb. 6, 1959, now U.S. Patent No. 3,138,743, issued June 23, 1964, for Miniaturized Electronic Circuits, and assigned to the same assignee as the present invention, there are described semiconductor networks employing very thin semiconductor wafers. Semiconductor networks of the type disclosed in said application are complete circuit configurations formed completely within solid bars of semiconductive material. The various elements such as resistors, capacitors and amplifying devices of such circuits are fabricated by attaching terminals to the semiconductive bar, forming PN junctions at appropriate locations on the semiconductor body and connecting terminals to the semiconductive bar so as to utilize the junctions and the semiconductive material per se to obtain the desired components. More specifically, the semiconductive material subsisting between two ohmic contacts on the semiconductive bar may constitute a resistive element while the capacitance existing within a back-biased PN junction may be employed as a capacitive element. Further, such junctions may be employed as diodes and connections may be made to dual junctions, that is, to PNP or NPN junctions, to form transistor amplifying elements. In the aforesaid U.S. Patent No. 3,138,743, various semiconductor networks are discussed and, in particular, multivibrator and phase shift oscillator embodiments are described. In both of these embodiments all of the amplifying elements, capacitors and resistors are formed directly by employing various sections on and junctions in a single semiconductive bar.

Semiconductor networks represent a vast advance in the art of circuit miniaturization and although use is made of many of the standard techniques normally employed in the fabrication of semiconductive diodes and transistors, many new techniques of fabrication are also required. For example, one step in a method for fabricating complete semiconductor network devices or individual transistors or diodes, a semiconductor wafer having a relatively large surface area is first treated uniformly over its entire surface area; that is, when a junction is formed, the junction is formed over one entire surface of the wafer and thereafter the large wafer may be cut into a number of small wafers, all of the same size which may then be mounted and thereafter have further junctions formed thereon or leads connected thereto to form the individual devices. The semiconductor networks thereafter generally require more handling and processing than single transistor or diode devices, since several different regions of each small semiconductor wafer for a semiconductor network device must be treated differently; whereas for a single transistor or diode device only one, or at the most, two, regions require further treatment. Nevertheless, the semiconductive wafers used to form any device are usually very thin, approximately 0.002 inch thick and are therefore quite delicate and difficult to handle. Further, when the wafers are etched to provide various surface configurations required to form desired circuit components, the wafers become so fragile that they are extremely difficult to handle without their breaking.

In accordance with one aspect of the present invention, the problems incident to handling the aforesaid thin semiconductive wafers are eliminated by attaching each wafer to a ceramic substrate or support which is sufficiently thick to resist breakage due to normal handling and treating. The semiconductive wafer should be affixed to the substrate in place as early in the processing as is possible and preferably immediately after the wafer has been cut to size. The material employed to bind the semiconductive wafer to the ceramic substrate must necessarily be subjected to all of the treatments to which the semiconductor wafer is subjected during the fabrication of the circuit therein and therefore must meet very severe requirements. More particularly, the binding material or cement used must be able to withstand the etching solutions employed to etch the surface of the semiconductive wafer to the desired configurations and it must be able to withstand treatment temperatures of up to 400° C. Further, the temperature coefficient of expansion of the binding material must be of the same order of magnitude as that of the semiconductive wafer and the ceramic substrate to prevent severe strains or cracking in the assembly. One binding material which has been found to meet these requirements and thus to be satisfactory in the practice of the present invention is manufactured by Corning Glass Works under the name Pyroceram Cement No. 95. Pyroceram Cement No. 95 is a low temperature thermal setting cement containing finely powdered glass of a special composition which composition is unknown to this inventor. Nevertheless, many other commercially available sealing compounds are suitable for use as the cements or glazes referred to herein.

It can be seen from the above that the method contemplated by a first feature of the invention involves cutting a semiconductor wafer into small wafers and mounting these wafers on a relatively strong ceramic wafer as soon as possible in the manufacturing process with a cement that is insensitive to the treatments to which the semiconductive wafer must be subjected during the fabrication of circuits or components therefrom. By this method a fabrication technique is provided for readily handling very thin semiconductive wafers during etching and forming of contacts and junctions thereon.

Also in accordance with a further feature of the present invention, the fabrication techniques of the first feature are extended to permit the ceramic substratum to be employed as one element of a very compact structure for providing a hermetic seal about the semiconductor device. More specifically, the ceramic wafer may be employed as one side of an enclosure disposed about the semiconductive wafer in which case the ceramic wafer must be sufficiently large to accommodate the other elements of the hermetic seal. If the ceramic wafer is thus employed, the material for cementing the semiconductive wafer to the ceramic substratum must be capable of maintaining a hermetic seal and the aforementioned cement of Corning has been found to be suitable for this purpose.

Where it is desired to apply external ohmic contacts to the semiconductive body, metallic tabs, silver paint or other suitable conductive material may be applied initially to the ceramic substratum and the semiconductor wafer may be positioned so as to overlie portions of a conductive strip or conductive strips on the ceramic so as to form an electric contact therewith. In such an arrangement, care must be taken to avoid applying cement to that area of the semiconductive bar which is to make electric contact with the conductive elements on the ceramic. Further, the conductive material may be applied to the ceramic so that it does not contact the semiconductive wafer, and a lead or leads may be connected from such conductive strips to various portions of the semiconductive bar so as to form other contacts therewith. If the ceramic wafer is to be employed as a means for making connections to the semiconductive wafer, the ceramic wafer would be made substantially larger than the semiconductive bar so that external leads may be readily connected to the conductive strips applied to the ceramic material external of the hermetic seal.

Accordingly, in one embodiment of the several aspects of the present invention, a ceramic wafer is initially provided with conductive strips, insulated from one another, which strips constitute all of the required external leads to the circuit. Thereafter, the semiconductive material may be placed upon the ceramic wafer so as to directly contact predetermined numbers of the conductive coatings on the ceramic. After treatment of the semiconductor wafer as described above, leads are connected between various predetermined locations on the upper surface of the semiconductive wafer and other of the conductive coatings or metallic strips on the ceramic substrata. Thereafter, a ring of nonconductive ceramic having a height greater than the semiconductive wafer is disposed thereabout and sealed to the ceramic wafer. The upper surface of this nonconductive ring may be metallized so that a metal plate may be suitably soldered or welded to the upper surface of the ring so as to complete the enclosure about the semiconductive wafer.

In a variation of the aforesaid sealing method, the ring may be formed of metal having a glaze formed about the lower edges thereof by heating a powdered glass in contact therewith and this glaze is sealed, by heating, to a glaze of the same diameter and general configuration as the ring applied to the ceramic substratum. Thereafter a metal plate may be secured to the other side of the metal ring to complete the enclosure.

The particular hermetic seal of this invention can be provided in less space than possible by prior art techniques of obtaining hermetic sealed devices. An example of the outline dimensions of a hermetically sealed device such as shown in FIGURES 1–3 made by this process would be a square base of 0.100" x 0.100" and a thickness of 0.020". Even though a device is formed with such minute dimensions, the end product is remarkably rugged and durable in use and these characteristics may be attributed in part to the use of a cemented construction in which the fragile leads extend from between a semiconductor and a ceramic base and through a glaze so they are reinforced several fold about their point of electrical contact.

It is an object of the present invention to provide a method and apparatus for handling various small and thin semiconductive wafers during the performance of mechanical operations thereon.

It is another object of the present invention to provide a method and apparatus for handling very small wafers of semiconductive materials during mechanical operation thereupon, which method employs a mounting technique that permits the ready connection of electrical contacts to the semiconductive wafer.

It is still another object of the present invention to provide a method of and apparatus for handling very small and thin semiconductive wafers during mechanical operations thereupon employing a mounting member that readily permits electrical contact to be made with the semiconductive wafer and which may thereafter form one wall or element of a hermetic seal disposed about the finished semiconductor element.

It is still another object of the present invention to provide a nonconductive ceramic substratum having conductive leads formed on one surface thereof and to employ the ceramic substratum as a support for a semiconductor wafer during mechanical operations upon the wafer and further to provide external contacts for these wafers by means of the conductive elements applied thereto.

It is another object of the present invention to provide a method and apparatus for hermetically sealing a semiconductive element.

The above and still further objects, features and advantages of the present invention will become apparent upon consideration of the following detailed description of various embodiments thereof, especially when taken in conjunction with the accompanying drawings, wherein.

Figure 1:
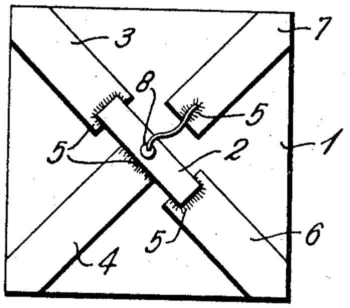
FIGURE 1 is a top view of a semiconductor element mounted on a ceramic substrate having conductive leads formed thereon.

Referring now specifically to FIGURE 1 of the accompanying drawings there is depicted an arrangement illustrating two aspects of the present invention. There is shown a nonconductive substrate or ceramic wafer 1 to which a small rectangular bar of semiconductive material 2 is secured as by means of a suitable cement previously described. The bar 2 in accordance with the first aspect of the present invention may be mounted on the wafer 1 immediately after cutting to desired dimensions and is retained on the wafer 1 throughout all further fabricating operations thereupon.

As previously indicated, the fabrication operations which may be performed upon the semiconductive bar 2 involve etching, heating, vapor deposition and other techniques relating to the formation of junctions and contacts thereon.

In accordance with a further feature of the present invention, the wafer 1 may serve as an instrumentality for readily connecting external leads to the semiconductive bar 2. More specifically, the wafer 1 may have formed on the surface thereof contacting the wafer 2, a plurality of conductive leads or strips such as those indicated by the reference numerals 3, 4, 6 and 7 which may or may not extend under the bar 2. As illustrated in FIGURE 1, the metallized conductors 3, 4 and 6 extend under the bar 2 so that when the bar is cemented to the wafer 1 and attached to the leads by solder or conductive cement 5, ohmic contact may be established between the bar 2 and the conductors 3, 4 and 6. The conductor 7, as is readily apparent from FIGURE 1, does not extend under the bar 2 and is employed to make contact via a lead 9 with a junction 8 formed on the upper surface of the bar 2. The junction 8 forms a semiconductor diode, and the connection to the elements of the diode are established via the conductors 4 and 7.

The specific circuit illustrated in FIGURE 1 provides a resistor between the conductors 3 and 6, the resistor constituting the semiconductive material subsisting between these conductors and further a junction diode which subsists between the conductor 4, a center tap to the resistor, and conductor 7. As will become readily apparent as the description of the present invention proceeds, the semiconductor structure with which the present invention is concerned is not restricted to any specific circuit configuration and is generally utilizable with all forms of semiconductor devices and semiconductor networks of which I am aware.

Figure 2:
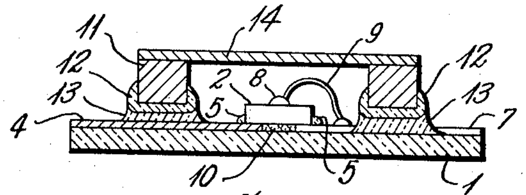
FIGURE 2 is a cross sectional view in elevation of a structure, similar to that shown in FIGURE 1, in which the ceramic substratum is employed as one element of a hermetic seal disposed about a semiconductor element.

Referring now to FIGURE 2 of the accompanying drawings there is illustrated a further extension of the structure illustrated in FIGURE 1. In accordance with this aspect of the present invention, a hermetic seal is formed about the semiconductive wafer 2, and the wafer 1 is employed as one of the elements of the hermetic seal. More specifically, there is provided a metal ring 11 having formed about the bottom and the lower portions of the sides thereof a nonconductive glaze 12. The wafer 1 is provided with a ring of low melting point nonconductive glaze 13 having internal and external diameters which are slightly greater than the internal and external diameters of the ring 11. The ring 11 is positioned on the wafer 1 such that the glaze 12 contacts the glaze 13 formed on the wafer and the structure is heated until the glaze 13 is sufficiently soft to form a bond with the glaze 12. Since the attachment of the glaze 12 to the metal ring 11 is performed remote from the semiconductor 2, this operation may take place at a higher temperature than that required to bond the two glazes 12 and 13 together. In actual practice, the glaze 12 and glaze 13 may be of different powdered glass materials so that the fusing temperature and coefficient of heat expansion of each may more nearly correspond to that of the material to which it is directly bonded prior to its being fused to the other glaze. In one embodiment the glaze 13 may be replaced by the aforementioned Corning Pyroceram cement and thereby positively eliminate any potential heat effect on the semiconductor wafer 2. In employing both glazes 12 and 13, the heat effect may be minimized by careful control of the bonding temperature and its duration. Thereafter a metal plate 14 may be soldered or welded to the upper surface of the ring 11 to complete the sealing operation. Obviously, the entire operation preferably takes place in a dry, inert or an evacuated chamber, so that any moisture is eliminated from the space defined by the hermetic seal.

As may be seen from FIGURE 2, the ring of glaze 13 is applied to the substrate 1 after the conductive contacts 4 and 7 are in place on the substrate. These contacts may be conductive paint or metallic tabs in which instance the glaze 13 may also function to hold the tabs in place on the substrate 1. The semiconductor element 2 may be affixed to the substrate by cement 10 as mentioned before or alternatively may be held in place solely by its soldered connections 5 to the conductive contacts 4 and 7.

It is seen from the above that the wafer 1 serves three distinct functions in the apparatus illustrated and the methods described in that it serves as a support for the bar 2 during its fabrication into the desired physical and electrical configuration, it constitutes a support for the external conductors employed to make various connections to the finished semiconductor element or elements and further serves as one element of a unit employed to provide a hermetic seal about the semiconductive element 2.

Figure 3:
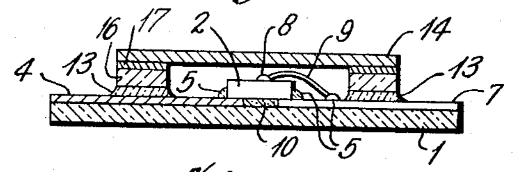
FIGURE 3 is a cross sectional view in elevation of a modification of the structure illustrated in FIGURE 2.

Referring now specifically to FIGURE 3 of the accompanying drawings, there is illustrated another embodiment of the hermetic seal that may be provided about the semiconductive element 2, which seal also employs the wafer 1 as one of the elements thereof. In this modification of the invention a ring 16 of ceramic, nonconductive material is directly bonded to the wafer 1 through a glaze 13, and the upper surface of the ring is provided with a metallized layer 17. Thereafter, a metal plate 14 may be welded, soldered or otherwise suitably secured to the metallized surface 17 to complete the hermetic seal about the semiconductive element 2.

Figures 4, 5, 6:
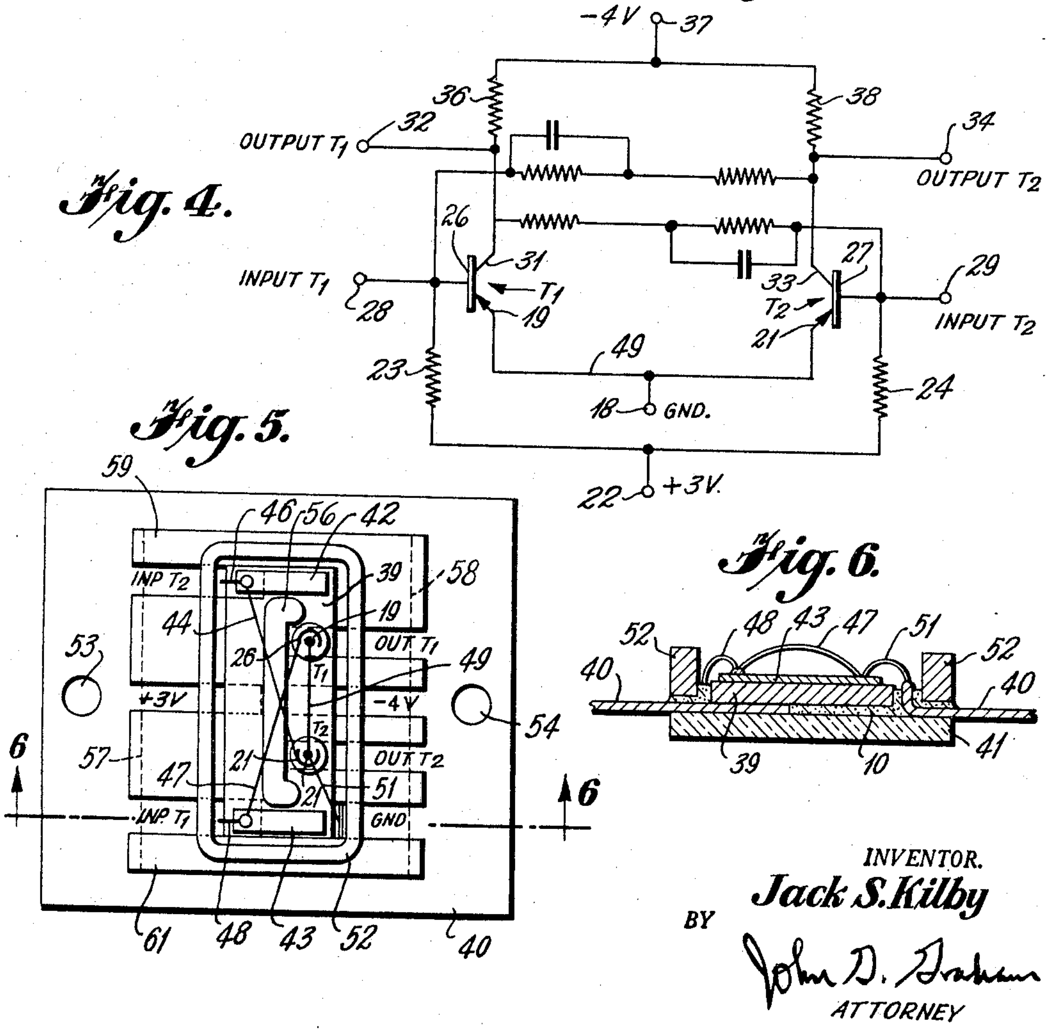
FIGURE 4 is a schematic circuit diagram of a semiconductor network which may be fabricated and packaged in accordance with the teachings of the present invention.
FIGURE 5 is a plan view of the semiconductor network embodying the circuit diagrammed in FIGURE 4 and illustrating an embodiment of this invention at one point during its fabrication.
FIGURE 6 is a cross sectional view taken along lines 6—6 of FIGURE 5.

Referring now specifically to FIGURE 4, there is schematically illustrated a multivibrator circuit which is also shown in FIGURE 7 of the aforesaid U.S. Patent No. 3,138,743. The operation and construction of the circuit illustrated in FIGURE 4 will not be discussed except to the extent required to adequately describe the novel concepts of the present invention. The multivibrator circuit is provided with two transistors T1 and T2 and various external connections to the circuit. An external ground terminal 18 is connected to emitter electrodes 19 and 21 of the transistors T1 and T2, respectively, and an external terminal 22, adapted to be connected to a three volt source, is connected via resistors 23 and 24, to base electrodes 26 and 27 of the transistors T1 and T2, respectively. The base electrode 26 of the transistor T1 is further connected to an input terminal 28 for the transistor T1 and the base 27 is connected to an input terminal 29 for the transistor T2. The transistor T1 is provided with a collector electrode 31 connected to an output terminal 32 of the transistor T1 and the transistor T2 is provided with a collector electrode 33 connected to an output terminal 34 of the transistor T2. The collector electrode 31 of transistor T1 is further connected through a resistor 36 to terminal 37 connected to a negative four volt supply, and the collector electrode 33 of the transistor T2 is connected through a resistor 38 to the terminal 37.

Referring now specifically to FIGURES 5 and 6 of the accompanying drawings, there is depicted a semiconductive wafer 39 having formed thereon all the elements illustrated in FIGURE 4. The wafer 39 is also illustrated in the aforesaid U.S. Patent No. 3,138,743 and may conform in every detail and respect to the structure described therein. The semiconductor wafer 39 is mounted on a thin metal lead sheet 40 having conductive strips formed therein. Sheet 40 may be formed by etching a very thin sheet of material which has a coefficient of expansion similar to that of silicon, as for example, an alloy of cobalt, nickel and iron known in the trade as Kovar. More particularly, the sheet 40 is provided with strips that correspond to the terminals 18, 22, 28, 29, 32, 34 and 37 as illustrated in FIGURE 4, and these strips are designated by the function which they serve in the diagram of FIGURE 4. More specifically, the strip labeled input T2 corresponds with the terminal 29 of FIGURE 4 also designated input T2. The other strips of FIGURE 5 serve the corresponding functions as determined by the labels applied thereto. It will be noted that all of the input strips except that labeled "ground" extend under the semiconductive wafer 39 and form contacts therewith, by virtue of the fact that semiconductor wafer 39 is mechanically positioned and subsequently alloyed on top of the strips. A ceramic glass or similar material substrate or wafer 41 of dimensions substantially equivalent to those of ring 52 is then affixed, as by cement 10, to the back side of the lead sheet 40 and semiconductor wafer 39 to provide reinforcement for this very thin lead sheet and the semiconductor element attached thereto during subsequent fabrication operations as well as during its functional use. Further, the semiconductive wafer 39 is provided with conductive metallized layers 42 and 43 formed by the process of vapor deposition at opposite ends of the semiconductor wafer and on the upper surface thereof remote from the sheet 40. The layer 42 is thermally bonded to lead wire 44 and connected via the lead 44 to the base electrode 27 of the transistor T2 and is further connected via a lead 46 to the strip designated input T2. The conductive layer 43 is connected via a lead 47 to the base electrode 26 of the transistor T1 and further connected via a lead 48 to the strip on the lead sheet 40 designated input T1. The emitter electrodes of the transistors T1 and T2 are connected together by a wire lead 49 and are connected via a lead 51 to the strip designated ground. It will be noted that all of the wire leads which are connected to the strips on the sheet 40 lie within a ring 52 which corresponds with the rings 11 and 16 of FIGURES 2 and 3, respectively. The ring 52 may be ceramic or metal and in either event is sealed to the sheet 40 and the substrate and completely surrounds the semiconductor wafer 39 and the connections thereto. Once the ring 52 has been appropriately secured to the sheet 40, a metal plate similar to plate 14 may be applied thereover and the sealing operation completed.

It will be noted that the sheet 40 is provided with index holes designated by the reference numerals 53 and 54. The holes 53 and 54 are indexing points which may also be in the form of indentations in the sheet 40 and serve to index the sheet and the semiconductor wafer in all of the machinery and other apparatus into which the sheet 40 and semiconductor wafer 39 may be inserted during various fabrication operations. These operations relate to etching of the semiconductive wafer 39, the formations of junctions and different conductivity regions therein, the formation of a slot 56 therein to isolate certain of the functional areas, the formation of conductive strips 42 and 43 thereon and the attachment of the various leads thereto. The indexing points 53 and 54 also serve to hold the sheet 40 during the application of the semiconductive wafer thereto, the placement of the wafer being critical since accurate alignment between this wafer and the conductive strips on the sheet 40 is essential so as to obtain proper resistance values between various points.

After the semiconductive wafer 39 has been hermetically sealed within its container, the sheet 40 may be trimmed along the dashed lines 57 and 58 to form a final assembly in which each of the conductive strips of the sheet 40 is electrically isolated from the others and in which a sufficient area of the strip extends externally of the ring 52 to provide for ready connection of external leads to the conductive strips or insertion of the wafer into printed circuit connectors.

It is apparent from the previous description of the present invention that a method and apparatus for assembly of semiconductive structures is provided in which a relatively small semiconductor wafer may be attached to a ceramic substratum for purposes of supporting the semiconductor wafer during mechanical operations thereon and in which the ceramic substratum may thereafter serve a useful purpose in the further fabrication of semiconductive integrated circuits and in the final form and structure of such circuits.

While several embodiments of this invention have been described and illustrated, it will be clear that variations of the details of construction which are specifically illustrated and described may be resorted to without departing from the true spirit and scope of the invention as defined in the appended claims.

I claim:

1. A method of enclosing a semiconductor device having PN junctions near one surface and spaced from the opposite surface of a semiconductor wafer comprising the steps of:

(a) providing an insulative support means having a flat solid portion on the upper surface thereof,
(b) positioning a metallic frame having a plurality of inwardly extending flat tabs over the upper surface of said support so that the inner ends of said flat tabs are coplanar with and spaced from each other around said solid flat portion,
(c) positioning a closed wall member about the periphery of said upper surface of said support over said flat tabs,
(d) sealing said flat tabs between said wall member and said support with insulating material,
(e) securing said opposite surface of said semiconductor wafer on said solid flat portion of said support,
(f) electrically connecting a plurality of flexible wires between selected regions on said one surface of said semiconductor wafer and selected ones of said flat tabs, and
(g) securing a cover to said wall member.

2. A method of enclosing an integrated semiconductor circuit device having a plurality of circuit elements adjacent one major surface of a semiconductor wafer comprising the steps of:

(a) providing an insulative support means having a solid flat portion on the upper surface thereof,
(b) placing a plurality of conductors in a coplanar array substantially parallel to said solid flat portion and extending past the periphery of said support, the inner ends of said conductors being spaced apart in a coplanar array around said solid portion over said upper surface of said support,
(c) sealing a closed wall member which is insulative between contacted conductors about the periphery of said support,
(d) securing the opposite major surface of said semiconductor wafer on said solid flat portion on the upper surface of said support,
(e) electrically connecting a plurality of flexible wires between selected regions on said one major surface of said semiconductor wafer and selected ones of said inner ends of said conductors, and
(f) sealing a cover to said wall member in substantially parallel relationship with said solid flat portion of said support.

3. A method according to claim 1, wherein said support is a single insulating member.

4. A method according to claim 2, wherein said support is a single insulating member.

5. A method according to claim 3, wherein said opposite surface of said semiconductor wafer is secured to said solid flat portion with an insulating binder having a thermal coefficient of expansion about the same as that of said semiconductor wafer and said support.

6. A method according to claim 4, wherein said opposite major surface of said semiconductor wafer is secured on said solid portion of said support with an insulating binder having a thermal coefficient of expansion about the same as that of said support and said semiconductor wafer.

7. A method according to claim 1, wherein at least one of the inner ends of said flat tabs is positioned between said support and said semiconductor wafer.

8. A method according to claim 2, wherein at least one of the inner ends of said conductors is positioned between said support and said semiconductor wafer.

References Cited

UNITED STATES PATENTS

| | | |
|---|---|---|
| 2,985,806 | 5/1961 | McMahon et al. |
| 3,021,461 | 2/1962 | Oakes et al. |
| 3,059,158 | 10/1962 | Doucette et al. |
| 3,220,095 | 11/1965 | Smith. |

WILLIAM I. BROOKS, *Primary Examiner.*

U.S. Cl. X.R.

29—627; 174—52; 317—101.